United States Patent
Namba et al.

(10) Patent No.: US 7,144,674 B2
(45) Date of Patent: Dec. 5, 2006

(54) POSITIVE RESIST COMPOSITION

(75) Inventors: Katsuhiko Namba, Toyonaka (JP); Masumi Suetsugu, Toyonaka (JP); Koshiro Ochiai, Toyonaka (JP)

(73) Assignee: Sumitomo Chemical Company, Limited, Osaka (JP)

( * ) Notice: Subject to any disclaimer, the term of this patent is extended or adjusted under 35 U.S.C. 154(b) by 19 days.

(21) Appl. No.: 10/390,903

(22) Filed: Mar. 19, 2003

(65) Prior Publication Data

US 2003/0219677 A1  Nov. 27, 2003

(30) Foreign Application Priority Data

Mar. 20, 2002  (JP) .............................. 2002-078354

(51) Int. Cl.
*G03C 1/73* (2006.01)
*G03F 7/039* (2006.01)

(52) U.S. Cl. .................... 430/270.1; 430/326; 430/905

(58) Field of Classification Search ............. 430/270.1, 430/326, 905, 909, 910, 914
See application file for complete search history.

(56) References Cited

U.S. PATENT DOCUMENTS

| 6,365,321 B1 * | 4/2002 | Chen et al. ............... 430/270.1 |
| 6,511,785 B1 * | 1/2003 | Takemura et al. ........ 430/270.1 |
| 6,692,888 B1 * | 2/2004 | Barclay et al. ........... 430/270.1 |
| 2003/0113658 A1 * | 6/2003 | Ebata et al. .............. 430/270.1 |
| 2004/0005506 A1 * | 1/2004 | Nishimura et al. ............ 430/17 |

OTHER PUBLICATIONS

Schlegel et al ("Determination of Acid Diffusion in Chemical Amplification Positive Deep Ultraviolet Resists", Journal of Vacuum Science and Technology, B, vol. 9 (2), 1991, p. 278-289.).*

* cited by examiner

*Primary Examiner*—Sin J. Lee
(74) *Attorney, Agent, or Firm*—Birch, Stewart, Kolasch & Birch, LLP

(57) ABSTRACT

The present invention provides a positive resist composition comprising
(A) at least one resin selected from the group consisting of
   ① resin which is itself insoluble or poorly soluble in an alkali aqueous solution but cause a chemical change by the action of an acid to become soluble in an alkali aqueous solution with a proviso that the resin is not novolak resin and
   ② alkali-soluble resin,
(B) novolak resin containing protective group which can be dissociated by the action of an acid and
(C) an acid generator.

8 Claims, No Drawings

POSITIVE RESIST COMPOSITION

This nonprovisional application claims priority under 35 U.S.C. § 119(a) on Patent Application No(s). 2002-078354 filed in JAPAN on Mar. 20, 2002, which is (are) herein incorporated by reference.

BACKGROUND OF THE INVENTION

1. Field of the Invention

The present invention relates to a resist composition suitable for lithography and the like acting by high-energy radiation such as ultraviolet ray (including g ray (436 nm), i ray (365 nm) and the like), far ultraviolet ray (including excimer laser and the like), electron beam, X ray or radiation light.

2. Prior Art

In the fields of producing semiconductor elements and liquid crystal elements, formation of patterns of high sensitivity and high resolution is required in photo resists necessary for fine processing of integrated circuits because of enhanced integration of integrated circuits. Recently, as a resist capable of attaining high sensitivity and high resolution, adopted are so-called chemical amplification type resists utilizing an acid catalysis and chemical amplification effect. With the chemical amplification type resist, acids generated from an acid generator in parts irradiated with radioactive ray are diffused by the post exposure bake (hereinafter, sometimes abbreviated as PEB), and the solubility of the irradiated parts in an alkali developer is changed by a reaction using the acid as a catalyst, and thereby positive or negative patterns are obtained.

In the chemical amplification type positive resist, when resin which itself is insoluble or poorly soluble in an alkali aqueous solution but becomes soluble in an alkali aqueous solution after dissociation of acid-labile group by the action of an acid is used, resolution is generally increased as the rate of protection by the acid-labile group is increased. However, such increase of protection rate tends to cause increase of patterns of standing wave (concave and convex of side walls), deterioration of line edge roughness of patterns and increase of irregularity in processing dimension. When the transmittance of photo resist is lowered for decreasing the patterns of standing wave or decreasing line edge roughness of patterns, the resolution tends to be deteriorated.

SUMMARY OF THE INVENTION

An object of the present invention is to provide a positive resist composition having improved pattern profile, particularly, roughness without allowing basic abilities such as sensitivity, resolution and the like to fall significantly.

The present inventors have found that pattern profile, particularly, roughness can be improved without significantly deteriorating the basic abilities of a resist by combining a combination of specific resins and an acid generator for a composition of a positive resist.

Namely, the present invention relates to the followings.

<1> A positive resist composition comprising (A) at least one resin selected from the group consisting of
① resin which is itself insoluble or poorly soluble in an alkali aqueous solution but cause a chemical change by the action of an acid to become soluble in an alkali aqueous solution with a proviso that the resin is not novolak resin and
② alkali-soluble resin, (B) novolak resin containing protective group which can be dissociated by the action of an acid and (C) an acid generator;

<2> The resist composition according to <1> wherein ① the resin which is itself insoluble or poorly soluble in an alkali aqueous solution but cause a chemical change by the action of an acid to become soluble in an alkali aqueous solution in the component (A) has a structural unit of the following formula (I):

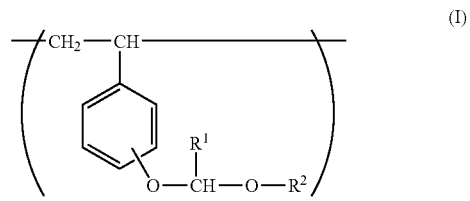

wherein $R^1$ represents alkyl having 1 to 4 carbon atoms, and $R^2$ represents alkyl having 1 to 6 carbon atoms or cycloalkyl having 5 to 7 carbon atoms, or $R^1$ and $R^2$ bond to form trimethylene chain or tetramethylene chain.

<3> The resist composition according to <1> wherein ① the resin which is itself insoluble or poorly soluble in an alkali aqueous solution but cause a chemical change by the action of an acid to become soluble in an alkali aqueous solution in the component (A) has at least one structural unit selected from the group consisting of the following formulae (IIa), (IIb) and (IIc):

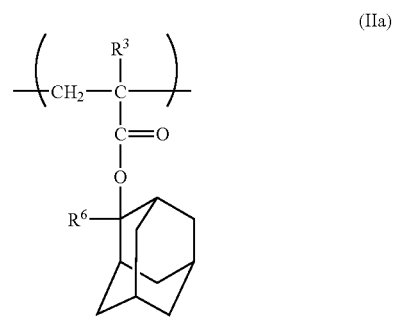

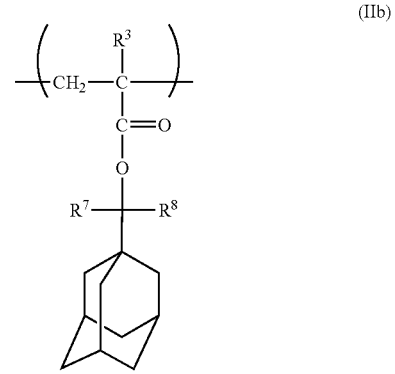

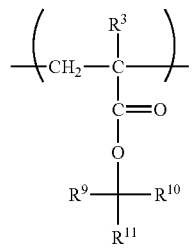

wherein $R^3$ to $R^5$ represent each independently hydrogen atom or methyl, and $R^6$ to $R^{11}$ represent each independently alkyl having 1 to 8 carbon atoms.

<4> The resist composition according to any one of <1> to <3> wherein ① the resin which is itself insoluble or poorly soluble in an alkali aqueous solution but cause a chemical change by the action of an acid to become soluble in an alkali aqueous solution in the component (A) further has a structural unit derived from p-hydroxystyrene.

<5> The resist composition according to any one of <1> to <4> wherein ① the resin which is itself insoluble or poorly soluble in an alkali aqueous solution but cause a chemical change by the action of an acid to become soluble in an alkali aqueous solution in the component (A) further has at least one structural unit derived from a monomer selected from the group consisting of 3-hydroxy-1-adamantyl (meth) acrylate and (meth)acrylonitrile.

<6> The resist composition according to any one of <1> to <5> wherein ② the alkali-soluble resin in the component (A) is at least one resin selected from the group consisting of cresol novolak resin, poly(p-hydroxystyrene), poly(meth) acrylic acid, partially protected cresol novolak resin by protective group which is not dissociated with an acid, partially protected poly(p-hydroxystyrene) by protective group which is not dissociated with an acid, partially protected poly(meth)acrylic acid by protective group which is not dissociated with an acid, and partially hydrogen substituted poly(p-hydroxystyrene) for hydroxyl group.

<7> The resist composition according to any one of <1> to <6> wherein (B) the novolak resin containing protective group which can be dissociated by the action of an acid is resin containing a structural unit having phenolic hydroxyl group partially protected with acetal group.

<8> The resist composition according to any one of <1> to <6> wherein (B) the novolak resin containing protective group which can be dissociated by the action of an acid is resin containing a structural unit having phenolic hydroxyl group partially protected with 1-ethoxyethyl group.

<9> The resist composition according any one of <1> to <6> wherein (B) the novolak resin containing protective group which can be dissociated by the action of an acid is phenol-novolak resin containing protective group which can be dissociated by the action of an acid, <10> The resist composition according to any one of <1> to <9>, further comprising a basic organic compound.

DETAILED DESCRIPTION OF PREFERRED EMBODIMENTS

In the resist composition of the present invention, one resin component is at least one resin selected from the group consisting of ① resin which is itself insoluble or poorly soluble in an alkali aqueous solution but cause a chemical change by the action of an acid to become soluble in an alkali aqueous solution (hereinafter referred to "RESIN 1") and ② alkali-soluble resin (hereinafter referred to "RESIN 2").

Examples of RESIN 1 include resins which become soluble in an alkali aqueous solution after dissociation of acid-labile group by the action of an acid and which contain protective group dissociated by the action of an acid. RESIN 1 is not novolak resin. Examples thereof can be those obtained by introducing protective group which can be dissociated by the action of an acid into alkali-soluble resins such as the resin having (meth)acrylic acid skeleton.

Such groups having an ability to suppress dissolution into an alkali developer but unstable to an acid can be various known protective groups. Examples thereof include tert-butyl; groups in which quaternary carbon is bonded to oxygen atom such as tert-butoxycarbonyl tert-butoxycarbonylmethyl, and the like; acetal type groups such as tetrahydro-2-pyranyl, tetrahydro-2-furyl, 1-ethoxyethyl, 1-(2-methylpropoxy)ethyl, 1-(2-methoxyethoxy)ethyl, 1-(2-acetoxyethoxy)ethyl, 1-[2-(1-adamantyloxy)ethoxy]ethyl, 1-[2-(1-adamantanecarbonyloxy)ethoxy]ethyl, and the like; residues of alicyclic compounds such as 3-oxocyclohexyl, 4-methyltetrahydro-2-pyron-4-yl which is derived from mevalonic lactone, 2-methyl-2-adamantyl, 2-ethyl-2-adamantyl and the like.

Such protective group will be substituted for hydrogen atom of phenolic hydroxyl group or hydrogen atom of carboxyl group. Such protective group can be introduced into an alkali-soluble resin having phenolic hydroxyl group or carboxyl group by a known protective group introduction reaction. RESIN 1 can be obtained also by copolymerization using an unsaturated compound having such protective group as one monomer.

RESIN 1 may partially include structural unit derived from p-hydroxystyrene, styrene, 3-hydroxy-1-adamantyl methacrylate or (meth)acrylonitrile.

As RESIN 1 in the component (A), resins having a structural unit of the following formula (I) can be listed:

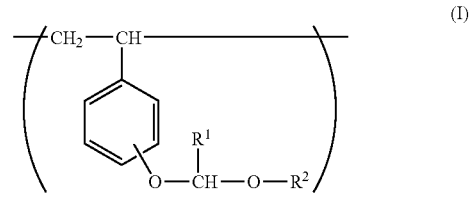

wherein $R^1$ represents alkyl having 1 to 4 carbon atoms, and $R^2$ represents alkyl having 1 to 6 carbon atoms or cycloalkyl having 5 to 7 carbon atoms, or $R^1$ and $R^2$ bond to form trimethylene chain or tetramethylene chain.

The RESIN 1 can also have structural unit derived from a monomer having vinyl group such as p-hydroxystyrene and styrene, in addition to the structural unit of the formula (I).

Examples of RESIN 1 include resins having at least one structural unit selected from the group consisting of the following formulae (IIa), (IIb) and (IIc):

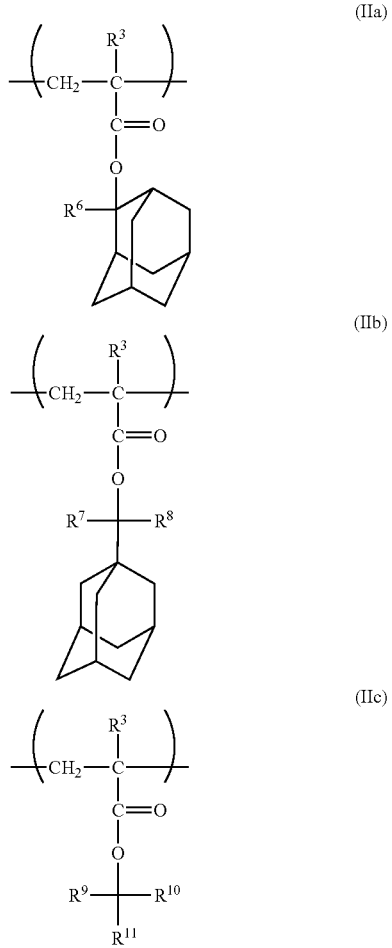

wherein $R^3$ to $R^5$ represent each independently hydrogen atom or methyl, and $R^6$ to $R^{11}$ represent each independently alkyl having 1 to 8 carbon atoms.

Examples of RESIN 1 include those further having structural unit derived from a monomer having vinyl group such as p-hydroxystyrene and styrene, in addition to the structural unit of the formulae (IIa), (IIb) or (IIc).

Examples of RESIN 1 include resins further having at least one structural unit derived from a monomer selected from the group consisting of 3-hydroxy-1-adamantyl (meth) acrylate and (meth)acrylonitrile in addition to the structural unit of the formulae (IIa), (IIb) or (IIc).

Examples of RESIN 2 in the component (A) include cresol novolak resins, poly(p-hydroxystyrene), poly(meth) acrylic acid, and the like. Hydroxyl groups or carboxyl groups of these resins may partially be protected by protective groups which is not dissociated with an acid or hydroxyl groups of these resins may partially be substituted by hydrogen atom as long as the resin is alkali soluble.

Examples of such groups which is not dissociated with an acid includes pivaloyl group, benzoyl group, ethyl group, iso-propyl group, cyclohexyl group and the like.

In the resist composition of the present invention, one of resin components is (B) novolak resin containing an introduced protective group which can be dissociated by the action of an acid (hereinafter referred to 'RESIN B'). The novolak resin before introduction of the above-mentioned protective group is usually obtained by condensing phenolic compound and aldehyde in the presence of acid catalyst.

As the phenolic compound used in production of the above-mentioned novolak resin, phenol can be singly used, and if necessary, other phenolic compounds such as phenol, o-, m- or p-cresol, 2,3-, 2,5-, 3,4- or 3,5-xylenol, 2,3,5-trimethylphenol, 2-, 3- or 4-tert-butylphenol, 2-tert-butyl-4- or 5-methylphenol, 2-, 4- or 5-methylresorcinol, 2-, 3- or 4-methoxyphenol, 2,3-, 2,5- or 3,5-dimethoxyphenol, 2-methoxyresorcinol, 4-tert-butylcatechol, 2-, 3- or 4-ethylphenol, 2,5- or 3,5-diethylphenol, 2,3,5-triethylphenol, 2-naphthol, 1,3-, 1,5- or 1,7-dihydroxynaphthalene, polyhydroxytriphenylmethane-based compounds obtained by condensation of xylenol and hydroxybenzaldehyde, and the like can be used in combination with phenol.

Examples of the aldehyde used in production of the above-mentioned novolak resin include acyclic aldehydes such as formaldehyde, acetoaldehyde, propionaldehyde, n-butylaldehyde, isobutylaldehyde, acrolein, crotonaldehyde, and the like; alicyclic aldehydes such as cyclohexylaldehyde, cyclopentylaldehyde, furfural, furylacrolein, and the like; aromatic aldehydes such as benzaldehyde, o-, m- or p-methylbenzaldehyde, p-ethylbenzaldehyde, 2,4-, 2,5-, 3,4- or 3,5-dimethylbenzaldehyde, o-, m- or p-hydroxybenzaldehyde, and the like; aromatic aliphatic aldehydes such as phenylacetaldehyde, cinnamic aldehyde, and the like.

The aldehydes can also be used each alone or in combination of two or more, if necessary. Among the aldehydes, formaldehyde is preferably used from the standpoint of industrial availability.

Examples of the acids catalyst used for condensation of phenolic compound and aldehyde include inorganic acids such as hydrochloric acid, sulfuric acid, perchloric acid, phosphoric acid, and the like; organic acids such as formic acid, acetic acid, oxalic acid, trichloroacetic acid, p-toluene-sulfonic acid, and the like; di-valent metal salts such as zinc acetate, zinc chloride, magnesium acetate, and the like. The acid catalysts can also be used each alone or in combination of two or more. The condensation reaction can be conducted according to a conventional method, and, for example, is conducted at a temperature of from 60 to 120° C. for about from 2 to 30 hours.

As the novolak resin, phenol novolak resin is preferable.

The phenol novolak resin obtained by condensation may be subjected, for example, operations such as fractionation and the like to give higher molecular weight main component having narrower molecular weight distribution by removing lower molecular weight fractions.

RESIN B may be that obtained by completely or partially introducing protective group which can be dissociated by the action of an acid into phenolic hydroxyl groups in the novolak resin obtained by condensation as described above, Such groups having an ability to suppress dissolution into an alkali developer but capable of dissociated by the action of an acid can be various known protective groups.

Examples thereof include tert-butyl; groups in which quaternary carbon is bonded to oxygen atom such as tert-butoxycarbonyl tert-butoxycarbonylmethyl, and the like; acetal type groups such as tetrahydro-2-pyranyl, tetrahydro- 2-furyl, 1-ethoxyethyl, 1-(2-methylpropoxy)ethyl, 1-(2-methoxyethoxy)ethyl, 1-(2-acetoxyethoxy)ethyl, 1-[2-(1-adamantyloxy)ethoxy]ethyl, 1-[2-(1-adamantanecarbonyloxy)ethoxy]ethyl, and the like; residues of alicyclic compounds such as 3-oxocyclohexyl, 4-methyltetrahydro-2-pyron-4-yl which is derived from mevalonic lactone, 2-methyl-2-adamantyl, 2-ethyl-2-adamantyl and the like, and these groups will be substituted for phenolic hydroxyl group. These protective groups can be introduced into phenolic hydroxyl group by a conventional protective group introduction reaction.

(C) The acid generator, another component of the positive resist composition, is that which is decomposed to generate an acid by allowing radioactive ray such as light and electron beam to act on the acid generator itself or a resist composition containing the acid generator. The acid generated from the acid generator acts on the above-mentioned resin, to dissociate acid-labile group present in the resin. Such acid generators include, for example, onium salt compounds, s-triazine-based organic halogen compounds, sulfone compounds, sulfonate compounds and the like.

Specific examples of the acid generators include the following compounds.
Diphenyliodonium trifluoromethanesulfonate,
4-methoxyphenylphenyliodinium hexafluoroantimonate,
4-methoxyphenylphenyliodinium trifluoromethanesulfonate,
bis(4-tert-butylphenyl)iodonium tetrafluoroborate
bis(4-tert-butylphenyl)iodonium perfluorobutanesulfonate,
bis(4-tert-butylphenyl)iodonium hexafluorophosphate,
bis(4-tert-butylphenyl)iodonium hexafluoroantimonate
bis(4-tert-butylphenyl)iodonium trifluoromethanesulfonate,
bis(4-tert-butylphenyl)iodonium camphorsulfonate,
triphenylsulfonium hexafluorophosphate,
triphenylsulfonium hexafluoroantimonate,
triphenylsulfonium trifluoromethanesulfonate,
triphenylsulfonium perfluorobutanesulfonate,
triphenylsulfonium perfluorobutanesulfonate,
tri(4-methylphenyl)sulfonium trifluoromethanesulfonate,
tri(4-methylphenyl)sulfonium perfluorobutanesulfonate,
tri(4-methylphenyl)sulfonium perfluorooctanesulfonate,
4-methylphenyldiphenylsulfonium perfluorobutanesulfonate,
4-methoxyphenyldiphenylsulfonium hexafluoroantimonate,
4-methoxyphenyldiphenylsulfonium trifluoromethanesulfonate,
p-tolyldiphenylsulfonium trifluoromethanesulfonate,
p-tolyldiphenylsulfonium perfluorobutanesulfonate,
p-tolyldiphenylsulfonium perfluorooctanesulfonate,
2,4,6-trimethylphenyldiphenylsulfonium trifluoromethanesulfonate,
4-tert-butylphenyldiphenylsulfonium trifluoromethanesulfonate,
4-phenylthiophenyldiphenylsulfonium hexafluorophosphate,
4-phenylthiophenyldiphenylsulfonium hexafluoroantimonate,
1-(2-naphtholylmethyl)thiolanium hexafluoroantimonate,
1-(2-naphtholylmethyl)thiolanium trifluoromethanesulfonate,
4-hydroxy-1-naphthyldimethylsulfonium hexafluoroantimonate,
4-hydroxy-1-naphthyldimethylsulfonium trifluoromethanesulfonate,
cyclohexylmethyl(2-oxocyclohexyl)sulfonium trifluoromethanesulfonate,
cyclohexylmethyl(2-oxocyclohexyl)sulfonium perfluorobutanesulfonate,
cyclohexylmethyl(2-oxycyclohexyl)sulfonium perfluorootcanesulfonate,
2-methyl-4,6-bis(trichloromethyl)-1,3,5-triazine,
2,4,6-tris(trichloromethyl)-1,3,5-triazine
2-phenyl-4,6-bis(trichloromethyl)-1,3,5-triazine,
2-(4-chlorophenyl)-4,6-bis(trichloromethyl)-1,3,5-triazine,
2-(4-methoxyphenyl)-4,6-bis(trichloromethyl)-1,3,5-triazine,
2-(4-methoxy-1-naphthyl)-4,6-bis(trichloromethyl)-1,3,5-triazine,
2-(benzo[d][1,3]dioxolan-5-yl)-4,6-bis(trichloromeythyl)-1,3,5-triazine,
2-(4-methoxystyryl)4,6-bis(trichloromethyl)-1,3,5-triazine,
2-(3,4,5-trimethoxystyryl)-4,6-bis(trichloromethyl)-1,3,5-triazine,
2-(3,4-dimethoxystyryl)-4,6-bis(trichloromethyl)-1,3,5-triazine,
2-(2,4-dimethoxystyryl)-4,6-bis(trichloromethyl)-1,3,5-triazine,
2-(2-dimethoxystyryl)-4,6-bis(trichloromethyl)-1,3,5-triazine,
2-(4-butoxystyryl)-4,6-bis(trichloromethyl)-1,35-triazine,
2-(4-pentyloxystyryl)-4,6-bis(trichloromethyl)-1,3,5-triazine,
1-benzoyl-1-phenylmethyl p-toluenesulfonate (generally called "benzoin tosylate"),
2-benzoyl-2-hydroxy-2-phenylethyl p-toluenesulfonate (generally called α-methylolbenzoin tosylate),
1,2,3-benzen-tri-yl tris(methanesulfonate),
2,6-dinitrobenzyl p-toluenesulfonate,
2-nitrobenzyl p-toluenesulfonate,
4-nitrobenzyl p-toluenesulfonate,
diphenyl disulfone,
di-p-tolyl disulfone
bis(phenylsulfonyl)diazomethane,
bis(4-chlorophenylsulfonyl)diazomethane,
bis(p-tolylsulfonyl)diazomethane,
bis(4-tert-butylphenylsulfonyl)diazomethane,
bis(2,4-xylylsulfonyl)diazomethane,
bis(cyclohexylsulfonyl)diazomethane,
(benzoyl)(phenylsulfonyl)diazomethane,
N-(phenylsulfonyloxy)succinimide,
N-(trifluoromethylsulfonyloxy)succinimide,
N-(trifluoromethylsulfonyloxy)phthalimide,
N-(trifluoromethylsulfonyloxy)-5-norbornene-2,3-dicarboxyimide,
N-(trifluoromethylsulfonyloxy)naphthalimide,
N-(10-camphorsulfonyloxy)naphthalimide,
(5-propylsulfonyloxyimino-5H-thiophen-2-ylidene)-(2-methylphenyl)acetonitrile,
(5-(4-methylphenyl)sulfonyloxyimino-5H-thiophen-2-ylidene)-(2-methylphenyl)acetonitrile,
(5-butylsulfonyloxyimino-5H-thiophen-2-ylidene)-(2-methylphenyl)acetonitrile,
(5-n-octylsulfonyloxyimino-5H-thiophen-2-ylidene)-(2-methylphenyl)acetonitrile,
(5-(2,4,6-trimethylphenyl)sulfonyloxyimino-5H-thiophen-2-ylidene)-(2-methylphenyl)acetonitrile,
(5-(2,4,6-triisopropylphenyl)sulfonyloxyimino-5H-thiophen-2-ylidene)-(2-methylphenyl)acetonitrile,
(5-(4-dodecylphenyl)sulfonyloxyimino-5H-thiophen-2-ylidene)-(2-methylphenyl)acetonitrile,
(5-(2-naphtyl)sulfonyloxyimino-5H-thiophen-2-ylidene)-(2-methylphenyl)acetonitrile, (1-benzylsulfonyloxyimino-5H-thiophen-2-ylidene)-(2-methylphenyl)acetonitrile)
(oxydi-4,1-phenylene)bisdiphenylsulfonium bis(methanesulfonate),
(oxydi-4,1-phenylene)bisdiphenylsulfonium bis(benzenesulfonate),
(oxydi-4,1-phenylene)bisdiphenylsulfonium bis(p-toluenesulfonate),
(oxydi-4,1-phenylene)bisdiphenylsulfonium bis(camphorsulfonate),
(oxydi-4,1-phenylene)bisdiphenylsulfonium bis(triisopropyobenzenesulfonate),
(oxydi-4,1-phenylene)bisdiphenylsulfonium bis(pentafluorobenzenesulfonate),
(oxydi-4,1-phenylene)bisdiphenylsulfonium bis(trifluoromethanesulfonate),
(oxydi-4,1-phenylene)bisdiphenylsulfonium bis(perfluorobutanesulfonate),
(oxydi-4,1-phenylene)bisdiphenylsulfonium bis(perfluorooctanesulfonate),
(oxydi-4,1-phenylene)bisdiphenylsulfonium bis{trifluoro-N-[(perfluoromethyl)sulfonyl]-1-methanesulfonamidate},
(oxydi-4,1-phenylene)bisdiphenylsulfonium bis{perfluoro-N-[(perfluoroethyl)sulfonyl]-1-ethanesulfonamidate},
(oxydi-4,1-phenylene)bisdiphenylsulfonium bis{perfluoro-N-[(perfluorobutyl)sulfonyl]-1-butanesulfonamidate},
(oxydi-4,1-phenylene)bisdiphenylsulfonium bis{trifluoro-N-[(perfluorobutyl)sulfonyl]-1-methanesulfonamidate},
(oxydi-4,1-phenylene)bisdiphenylsulfonium bis(tetrafluoroborate),
(oxydi-4,1-phenylene)bisdiphenylsulfonium bis(hexafluoroarsenate),
(oxydi-4,1-phenylene)bisdiphenylsulfonium bis(hexafluoroantimonate),
(oxydi-4,1-phenylene)bisdiphenylsulfonium bis(hexafluorophosphate),
(oxydi-4,1-phenylene)bisdi(4-tert-butylphenyl)sulfonium bis(trifluoromethanesulfonate),
(oxydi-4,1-phenylene)bisdi(4-tert-butylphenyl)sulfonium bis(perfluorobutanesulfonate),
(oxydi-4,1-phenylene)bisdi(p-tolyl)sulfonium bis(trifluoromethanesulfonate), triphenylsulfonium (adamantan-1-ylmethyl)oxycarbonyldifluoromethanesulfonate, and the like.

A basic organic compound may preferably be contained in the present positive resist composition, because performance deterioration due to the deactivation of an acid associated with leaving after exposure can be reduced. In such case, the basic organic compound is also called a quencher. Examples of the basic compounds include nitrogen-containing basic organic compound. Specific examples of the nitrogen-containing organic compound include the ones represented by the following formulae:

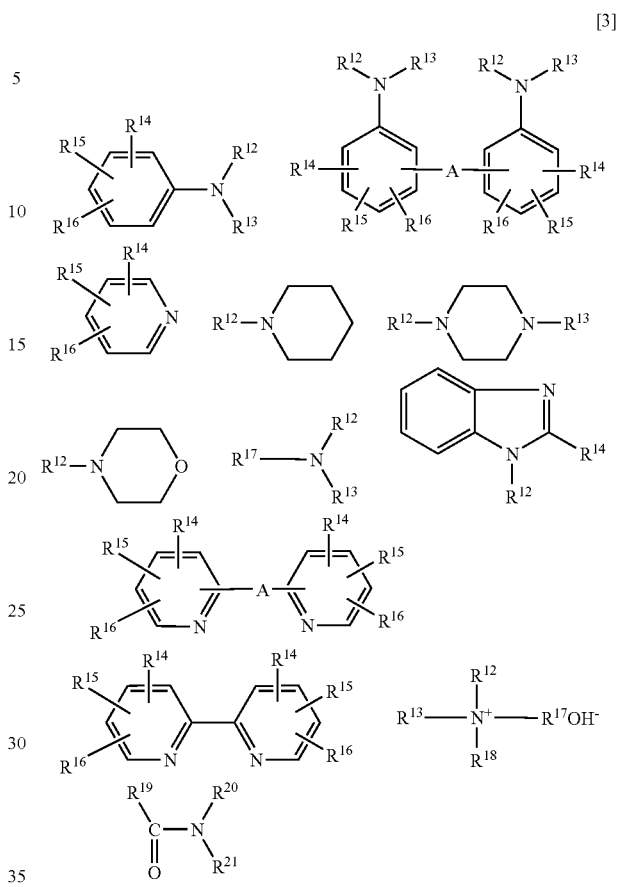

[3]

In the formulae, $R^{12}$, $R^{13}$ and $R^{14}$ each independently represent hydrogen, alkyl, cycloalkyl or aryl. The alkyl preferably has about 1 to 6 carbon atoms, the cycloalkyl preferably has about 5 to 10 carbon atoms, and the aryl preferably has about 6 to 10 carbon atoms, Furthermore, at least one hydrogen on the alkyl, cycloalkyl or aryl may each independently be substituted with hydroxyl group, amino group, or alkoxy group having 1 to 6 carbon atoms. At least one hydrogen on the amino group each independently may be substituted with alkyl group having 1 to 4 carbon atoms.

$R^{14}$, $R^{15}$ and $R^{16}$ each independently represent hydrogen, alkyl, cycloalkyl, aryl or alkoxy. The alkyl preferably has about 1 to 6 carbon atoms, the cycloalkyl preferably has about 5 to 10 carbon atoms, the aryl preferably has about 6 to 10 carbon atoms, and the alkoxy preferably has about 1 to 6 carbon atoms. Furthermore, at least one hydrogen on the alkyl, cycloalkyl, aryl or alkoxy each independently may be substituted with hydroxyl group, amino group, or alkoxy group having 1 to 6 carbon atoms. At least one hydrogen on the amino group may be substituted with alkyl group having 1 to 4 carbon atoms.

$R^{17}$ represents alkyl or cycloalkyl. The alkyl preferably has about 1 to 6 carbon atoms, and the cycloalkyl preferably has about 5 to 10 carbon atoms. Furthermore, at least one hydrogen on the alkyl or cycloalkyl may each independently be substituted with hydroxyl group, amino group, or alkoxy group having 1 to 6 carbon atoms. At least one hydrogen on the amino group may be substituted with alkyl group having 1 to 4 carbon atoms.

However, none of $R^{12}$, $R^{13}$, $R^{17}$ and $R^{18}$ in the compound represented by the above formula [3] is hydrogen.

A represents alkylene, carbonyl, imino, sulfide or disulfide. The alkylene preferably has about 2 to 6 carbon atoms.

Moreover, among $R^{12}$–$R^{18}$, in regard to those which can be straight-chained or branched, either of these may be permitted.

$R^{19}$, $R^{20}$ and $R^{21}$ each independently represent hydrogen, alkyl having 1 to 6 carbon atoms, aminoalkyl having 1 to 6 carbon atoms, hydroxyalkyl saving 1 to 6 carbon atoms or substituted or unsubstituted aryl having 6 to 20 carbon atoms, or $R^{19}$ and $R^{20}$ bond to form alicyclic hydrocarbon ring together with adjacent carbon atom.

Examples of such compounds include hexylamine, heptylamine, octylamine, nonylamine, decylamine, aniline, 2-, 3- or 4-methylaniline, 4-nitroaniline, 1- or 2-naphtylamine, ethylenediamine, tetramethylenediamine, hexamethylenediamine, 4,4'-diamino-1,2-diphenylethane, 4,4'-diamino-3,3'-dimethyldiphenylmethane, 4,4'-diamino-3,3'-diethyldiphenylmethane, dibutylamine, dipentylamine, dihexylamine, diheptylamine, dioctylamine, dinonylamine, didecylamine, N-methylaniline, piperidine, diphenylamine, triethylamine, trimethylamine, tripropylamine, tributylamine, tripentylamine, trihexylamine, triheptylamine, trioctylamine, trinonylamine, tridecylamine, methyldibutylamine, methyldipentylamine, methyldihexylamine, methyldicyclohexylamine, methyldiheptylamine, methyldioctylamine, methyldinonylamine, methyldidecylamine, ethyldibutylamine, ethydipentylamine, ethyldihexylamine, ethydiheptylamine, ethyldioctylamine, ethyldinonylamine, ethyldidecylamine, dicyclohexylmethylamine, tris[2-(2-methoxyethoxy)ethyl]amine, triisopropanolamine, N,N-dimethylaniline, 2,6-isopropylaniline, imidazole, pyridine, 4-methylpyridine, 4-methyimidazole, bipyridine, 2,2'-dipyridylamine, di-2-pyridyl ketone, 1,2-di(2-pyridyl)ethane, 1,2-di(4-pyridyl)ethane, 1,3-di(4-pyridyl)propane, 1,2-bis(2-pyridyl)ethylene, 1,2-bis(4-pyridyl)ethylene, 1,2-bis(2-pyridyloxy)ethane, 4,4'-dipyridyl sulfide, 4,4'-dipyridyl disulfide, 1,2-bis(4-pyridyl)ethylene, 2,2'-dipicolylamine, 3,3'-dipicolylamine, tetramethylammonium hydroxide, tetraisopropylammonium hydroxide, tetrabutylammonium hydroxide, tetra-n-hexylammonium hydroxide, tetra-n-octylammonium hydroxide, phenyltrimethylammonium hydroxide, 3-trifluoromethylphenyltrimethylammonium hydroxide, (2-hydroxyethyl)trimethylammonium hydroxide (so-called "cholline"), N-methylpyrrolidone, dimethylimidazole, and the like.

Furthermore, hindered amine compounds having piperidine skeleton as disclosed in JP-A-H11-52575 can be used as quencher.

In the present positive resist composition, the content of (A) at least one resin selected from RESIN 1 and RESIN 2, RESIN B, and (C) the acid generator is preferably 30 to 98.9% by weight, 1 to 69.9% by weight and 0.1 to 20% by weight, respectively, and more preferably, 65 to 98.5% by weight, 1 to 25% by weight and 0.5 to 10% by weight, respectively, based on the content of total solid components in the present positive resist composition. In resin components of the present positive resist composition, the ratio of P:Q is preferably 1:6 to 1:1, wherein P is total molar amount of the structural units having protective group which can be dissociated by the action of an acid into alkali-soluble resin and Q is the total molar amount of the structural units which itself make resin alkali-soluble.

When a basic organic compound is used as a quencher in the present positive resist composition, the content of the basic organic compounds is preferably 0.01 to 10% by weight based on the content of total solid components in the present positive resist composition.

The present positive resist composition may also contain various Additives such as sensitizers, dissolution inhibitors, resins other than the above resin, surfactants, stabilizers, and dyes as long as the effect of the present invention is not obstructed.

The present resist composition generally becomes a liquid resist composition under the circumstances in which each of the above-described components is dissolved in a solvent. The liquid resist composition is applied on a substrate such as a silicon wafer according to a usual procedure such as spin coating.

Any solvent may be used as long as they dissolve each component, show suitable drying speed, and give a uniform and smooth film after evaporation of the solvent. Solvents generally used in this field can be used as the solvent.

Examples thereof include glycol ether esters such as ethylcellosolve acetate, methylcellosolve acetate, propylene glycol monomethyl ether acetate and the like; esters such as ethyl lactate, butyl acetate, amyl acetate, ethyl pyruvate and the like; ketones such as acetone, methyl isobutyl ketone, 2-heptanone, cylohexanone and the like; cyclic esters such as γ-butyrolactone and the like; alcohols such as 3-methoxybutanol and the like. These solvents can be used each alone or in combination of two or more.

The resist film applied on a substrate, and dried is subjected to an exposure treatment for patterning. Then, after a heat-treatment for promoting a deprotecting reaction (hereinafter referred to 'PEB'), Development by an alkali developer is conducted, The alkali developer used herein can be various kinds of aqueous alkaline solutions used in this art. In general, aqueous solution of tetramethylammonium hydroxide or (2-hydroxyethyl)trimethylammonium hydroxide (generally referred to as colline) is often used.

It should be construed that embodiments disclosed here are examples in all aspects and not restrictive. It is intended that the scope of the present invention is determined not by the above descriptions but by appended claims, and includes all variations of the equivalent meanings and ranges to the claims.

The present invention will be further illustrated by examples. However, the present invention is not limited to them at all.

In the examples, % and parts showing content and use amount are by weight unless otherwise stated. Weight-average molecular weight (Mw) and degree of polydispersion (Mw/Mn) are values measured by gel permeation chromatography using polystyrene as a standard.

SYNTHESIS EXAMPLE 1

Synthesis of Partially Etherified poly(p-hydroxystyrene) with 1-ethoxyethyl Group Into a 1 liter eggplant type flask was charged 40 g of poly(p-hydroxystyrene) [Weight-average molecular weight 18000, degree of dispersion: 1.1] (333 mmol calculated using molecular weight of p-hydroxystyrene structural unit) and 47 mg (0.25 mmol) of p-toluenesulfonic acid monohydrate, and these were dissolved in 720 g of propylene glycol monomethyl ether acetate. This solution was subjected to pressure-reduced distillation under conditions of a temperature of 60° C. and a pressure of 10 Torr (1333 Pa) or less, to cause azeotropic dehydration. The weight of the solution after distillation was 337 g. This solution was transferred into a nitrogen-purged 500 ml four-necked flask, into this was dropped 12.0 g (166 mmol) of ethyl vinyl ether, then, these were reacted at 25° C. for 5 hours. To the reaction solution was added 62.3 g of propylene glycol monomethyl ether acetate and 320 g of methyl isobutyl ketone, further, 240 ml of ion-exchanged water was added and the mixture was stirred. Then, the mixture was allowed to stand still, to take out an organic layer portion. To the organic layer was added again 240 ml of ion exchanged water, the mixture was stirred for washing, then, allowed to stand still to cause liquid separation. Washing with ion exchanged water and liquid separation were conducted again, then, the organic layer was taken out and distilled under reduced pressure for removal of water and methyl isobutyl ketone by azeotropic distillation with propylene glycol monomethyl ether acetate, to give propylene glycol monomethyl ether acetate solution. The resulted solution of partially etherified poly(p-hydroxystyrene) with 1-ethoxyethyl group was obtained, and the polymer was analyzed by $^1$H-NMR. 36% of hydroxyl group in poly(p-hydroxystyrene) was etherified with 1-ethoxyethyl group. This polymer is called resin A1.

SYNTHESIS EXAMPLE 2

Synthesis of Partially Etherified poly(p-hydroxystyrene) with 1-ethoxyethyl Group Reaction, post treatment and analysis were conducted in the same Hanner as in Synthesis Example 1 except that the amount of ethyl vinyl ether was changed to 10 g (138 mmol) to obtain solution of partially etherified poly(p-hydroxystyrene) with 1-ethoxyethyl group. 30% of hydroxyl group in poly(p-hydroxystyrene) was etherified 1-ethoxyethyl group. This polymer is called resin A2.

SYNTHESIS EXAMPLE 3

Synthesis of Partially Esterified poly(p-bydroxystyrene) with 1-pivaloyl Group 20 parts of poly(p-hydroxystyrene) ["PHS-15E01" manufactured by Try Quest K.K., weight-average molecular weight: 15000, degree of dispersion: 2.0] (0.17 mol calculated using molecular weight of p-hydroxystyrene structural unit) and 200 parts of acetone were charged and stirred for dissolution thereof, then, to this was added 6.3 parts (0.06 mol) of triethylamine and the mixture was heated at 35° C. Into this resin solution was dropped 5.8 parts of pivaloyl chloride (0.047 mol, 0.29 equivalent based on hydroxyl group of poly(p-hydroxystyrene)) over about 10 minutes. The mixture was stirred at 35° C. for 1.5 hours, then, 300 parts of methyl isobutyl ketone was added, and the mixture was washed with a 0.5% oxalic acid aqueous solution three times. The resulted organic layer was further washed with ion-exchanged water to cause liquid separation, and this operation was repeated five times. From this organic layer, the solvent was distilled off for concentration until the resin solution content became 70 parts. Then, 200 parts of propylene glycol monomethyl ether acetate was added, and the mixture was further concentrated to 69 parts to obtain solution of partially esterified poly(p-hydroxystyrene) with 1-pivaloyl group. The resulted polymer was analyzed by $^1$H-NMR. 28% of hydroxyl group in poly(p-hydroxystyrene) was esterified with pivaloyl group. This resin is called resin A3.

SYNTHESIS EXAMPLE 4

Synthesis of Partially Esterified poly(p-hydroxystyrene) with 1-pivaloyl Group

Reaction, post treatment and analysis were conducted in the same manner as in Synthesis Example 3 except that the amount of pivaloyl chloride was changed to 4.0 g (0.032 mol, 0.20 equivalent based on hydroxyl group in poly(p-hydroxystyrene)) to obtain solution of partially esterified poly(p-hydroxystyrene) with 1-pivaloyl group. 20% of hydroxyl group in poly(p-hydroxystyrene) was esterified with pivaloyl group. This resin is called resin A4.

SYNTHESIS EXAMPLE 5

Synthesis of Partially Etherified Phenol Novolak Resin with 1-ethoxyethyl Group (1) Into a flask was charged 80 g of a phenol novolak resin["PSM-4326" Manufactured by Gunei Kagaku K.K.], and 640 g of methyl isobutyl ketone was added for dissolution thereof. This phenol novolak resin solution was washed with ion-exchanged water five times. The washed resin solution has concentrated until 212 g. The resin content of this resin solution was 36.3%.

(2) In the flask was charged 55.1 g (189 mmol: calculated using molecular weight of structural unit) of the resin solution obtained in (1), 84.9 g of methyl isobutyl ketone and 3.6 mg (0.0189 mmol) of p-toluenesulfonic acid monohydrate. Into this resin solution was dropped 5.39 g (74.7 mmol) of ethyl vinyl ether, then, the mixture was reacted at room temperature for 3 hours.

(3) To this reaction solution was added ion exchanged water and the mixture was stirred, then, allowed to stand still to take out an organic layer portion by liquid separation. This washing with ion-exchanged water was repeated four times, five times in total. Then, the organic layer was taken out and concentrated. Then, for removal of water and methyl isobutyl ketone by azeotropic distillation, propylene glycol monomethyl ether acetate was added and the mixture was further concentrated to obtain 64.0 g of resin solution.

The resulted liquid is solution of partially etherified phenol novolak resin with 1-ethoxyethyl group, and this resin was analyzed by $^1$H-NMR. 25.7% of hydroxyl group in the phenol novolak resin was etherified with 1-ethoxyethyl group. The concentration of the resin solution was 37.5% which was measured by a dry weight reduction method. This resin is called resin A5.

SYNTHESIS EXAMPLE 6

Synthesis of Partially Etherified Phenol Novolak Resin with 1-ethoxyethyl Group

Using 55.1 g (189 mmol: calculated using molecular weight of structural unit) of solution of the phenol novolak resin obtained in Synthesis Example 5 (1), reaction, post treatment and analysis were conducted in the same manner as in Synthesis Example 5 (2) and (3) except that the amount of ethyl vinyl ether was changed to 8.38 g (116 mmol) to obtain 65.5 g of resin solution.

45.0% of hydroxyl group in the phenol novolak resin was etherified with 1-ethoxyethyl group. The concentration of the resin solution was 34.1%. This resin is called resin A6.

SYNTHESIS EXAMPLE 7

Fractionation of Phenol Novolak Resin 50 g of a phenol novolak resin having weight-average molecular weight of 5360 ('PSM4326' manufactured by Gunei Kagaku K.K.) was charged in a 1 L bottom-pull flask, and diluted with and dissolved into 335 g of methyl isobutyl ketone, and 273 g of n-heptane was charged and the mixture was stirred at 60° C., allowed to stand still, then, separated, to obtain lower layer, novolak resin solution. This novolak resin solution was diluted with propylene glycol methyl ether acetate and concentrated to obtain solution of the novolak resin in propylene glycol methyl ether acetate.

This resin was measured by gel permeation chromatography (GPC) using polystyrene as a standard to find that the area ratio of molecular weights of 1000 or less to the total pattern area excepting unreacted monomers was 6.7%. The weight-average molecular weight of this resin as 10945. This resin is called resin A7.

SYNTHESIS EXAMPLE 8

Synthesis of Partially Etherified Phenol Novolak Resin with 1-ethoxyethyl Group Into a flask was charged 34.8 g (123 mmol: calculated using molecular weight of structural unit) of the methyl isobutyl ketone solution of the phenol novolak resin obtained in Synthesis Example 7, 56.3 g of methyl isobutyl ketone and 2.3 mg (0.0123 mmol) of p-toluenesulfonic acid monohydrate. Into this resin solution was dropped 1.93 g (27 mmol) of ethyl vinyl ether, then, they were reacted at room temperature for 3 hours. To this reaction solution was added 30.3 ml of ion exchanged water and the mixture was stirred, then, allowed to stand still to take out an organic layer portion by liquid separation. This washing with ion-exchanged water was repeated four times, five times in total. Then, the organic layer was taken out and concentrated. Then, for removal of water and methyl isobutyl ketone by azeotropic distillations propylene glycol monomethyl ether acetate was added and the mixture was concentrated by distillation under reduced pressure to obtain 42.0 g of resin solution.

The resulted liquid is solution of partially etherified phenol novolak resin with 1-ethoxyethyl group, and this resin was analyzed by $^1$H-NMR. 16.5% of hydroxyl group in the phenol novolak resin was etherified with 1-ethoxyethyl group. The concentration of the resin solution was 37.5% which was measured by a dry weight reduction method. This resin is called resin A8.

EXAMPLES 1 TO 2 AND COMPARATIVE EXAMPLE 1

Acid Generator B1: bis(cycohexylsulfonyl)diazomethane ["DAM-301" manufactured by Midori Kagaku K.K.]
Acid Generator B2: triphenylsulfonium 2,4,6-triisopropylbenzenesulfonate
Quencher C1: dicyclohexylmethylamine
Quencher C2: tris[2-methoxy(2-ethoxyethyl)]amine
Additive D1:
2,2'-bis(4-hydroxycyclohexyl)propane=bis(4-methylbenzenesulfonate)

Resins (13.5 parts in total, calculated as solid content) were mixed at a ratio (calculated as solid content) shown in Table 1, and 0.4 part of the Acid Generator B1, 0.15 part of the Acid Generator B2, 0.03 part of the Quencher C1, 0.03 part of the Quencher C2 and 0.05 part of the Additive D1 were dissolved each using propylene glycol monomethyl ether acetate as dilution solvent, further, the mixtures was filtrated through fluorine resin filter having pore diameter of 0.2 μm, to prepare resist solution.

On a silicon wafer treated with hexamethyldisilazane, the above-mentioned resist solution was applied using a rotation applicator so that the membrane thickness after prebake drying was 1.05 μm. Prebake after application of the resist solution was conducted at 100° C. for 60 seconds on a hot plate. The wafer carrying thus formed resist membrane was exposed to line and space pattern using a KrF excimer laser exposure ["NSR 2205EX12B" manufactured by Nikon Corp., NA=0.55, σ=0.8]. Then, post exposure bake was conducted at 110° C. for 60 seconds on a hot plate, further, paddle development was conducted with a 2.38% tetramethylammonium hydroxide aqueous solution for 60 seconds. The pattern after the development was observed by a scanning type electron microscope, and effective sensitivity, resolution and profile were checked according to the following methods. The results are shown in Table 2. Effective sensitivity: It is represented by exposure amount when line and space pattern of 0.25 μm is 1:1.

Dense resolution: It is represented by the minimum size of separated 1:1 line and space pattern at the exposure amount fixed as Effective sensitivity. Slit resolution: It is represented by the minimum size of the separated space pattern of a slit at the exposure amount fixed as Effective sensitivity.

Roughness: When the section of pattern is observed from the side face, the mark 'x' means that standing wave is recognized, and the mark 'o' means that no standing wave is recognized.

TABLE 1

| Example No. | Resin | | | | |
|---|---|---|---|---|---|
| Example 1 | A1/46% | A2/24% | A3/12% | A4/13% | A5/5% |
| Example 2 | A1/46% | A2/24% | A3/12% | A4/13% | A6/5% |
| Example 3 | A1/46% | A2/24% | A3/12% | A4/13% | A8/5% |
| Comparative example 1 | A2/50% | A3/25% | A3/12% | A4/13% | |

TABLE 2

| Example No. | Effective sensitivity [mJ/cm$^2$] | Dense resolution [μm] | Slit resolution [μm] | Roughness |
|---|---|---|---|---|
| Example 1 | 44 | 0.20 | 0.20 | ○ |
| Example 2 | 45 | 0.19 | 0.20 | ○ |
| Example 3 | 39 | 0.20 | 0.21 | ○ |
| Comparative example 1 | 40 | 0.20 | 0.22 | X |

The chemical amplification type positive resist composition of the present invention can improve standing wave, roughness and resolution without decreasing sensitivity. Further, it has also excellent various properties such as applicability, membrane remaining ratio, heat resistance, close adherence and the like.

What is claimed is:
1. A positive resist composition comprising
(A) resin which is itself insoluble or poorly soluble in an alkali aqueous solution but due to a chemical change by the action of an acid becomes soluble in an alkali aqueous solution with a proviso that the resin is not novolak resin and has a structural unit of the following formula (I):

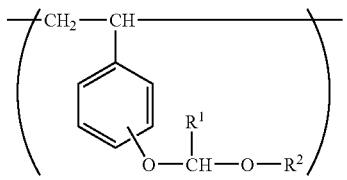

wherein $R^1$ represents alkyl having 1 to 4 carbon atoms, and $R^2$ represents alkyl having 1 to 6 carbon atoms or cycloalkyl having 5 to 7 carbon atoms, or $R^1$ and $R^2$ bond to form trimethylene chain or tetramethylene chain, (B) novolak resin containing a structural unit having a phenolic hydroxyl group partially protected with an acetal group which can be dissociated by the action of an acid and (C) an acid generator.

2. The resist composition according to claim 1 wherein the resin in the component (A) further has a structural unit derived from p-hydroxystyrene.

3. The resist composition according to claim 1 wherein the resin in the component (A) further has at least one structural unit derived from a monomer selected from the group consisting of 3-hydroxy-1-adamantyl (meth)acrylate and (meth)acrylonitrile.

4. The resist composition according to claim 1 wherein the composition further comprises an alkali-soluble resin which is at least one resin selected from the group consisting of cresol novolak resin, poly(meth)acrylic acid, partially protected poly(p-hydroxystyrene) having a protective group which is not dissociated with an acid, and partially hydrogen substituted poly(p-hydroxystyrene) having hydrogen substituents for hydroxyl groups.

5. The resist composition according to claim 1 wherein (B) the novolak resin containing a structural unit having a phenolic hydroxyl group partially protected with an acetal group which can be dissociated by the action of an acid is resin containing a structural unit having a phenolic hydroxyl group partially protected with a 1-ethoxyethyl group.

6. The resist composition according claim 1 wherein (B) the novolak resin containing a structural unit having a phenolic hydroxyl group partially protected with an acetal group which can be dissociated by the action of an acid is phenol-novolak resin containing a structural unit having a phenolic hydroxyl group partially protected with an acetal group which can be dissociated by the action of an acid.

7. The resist composition according to claim 1, further comprising a basic organic compound.

8. The resist composition according to claim 1 wherein $R^1$ and $R^2$ in the formula (I) are methyl and ethyl, respectively.

* * * * *